US 6,518,709 B2

(12) United States Patent
Iketsu et al.

(10) Patent No.: US 6,518,709 B2
(45) Date of Patent: Feb. 11, 2003

(54) COLOR ORGANIC EL DISPLAY AND METHOD FOR DRIVING THE SAME

(75) Inventors: Yuichi Iketsu, Tokyo (JP); Eiichi Kitazume, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/973,794

(22) Filed: Oct. 11, 2001

(65) Prior Publication Data

US 2002/0043941 A1 Apr. 18, 2002

(30) Foreign Application Priority Data

Oct. 16, 2000 (JP) ...................................... 2000-315627

(51) Int. Cl.[7] .............................................. G09G 3/10
(52) U.S. Cl. ..................................... 315/169.3; 313/505
(58) Field of Search ........................... 315/169.3, 169.4;
313/500, 504, 505, 506, 521; 349/108,
78, 83; G09G 3/10

(56) References Cited

U.S. PATENT DOCUMENTS

| | | | | |
|---|---|---|---|---|
| 3,911,467 A | * | 10/1975 | Levine et al. | 257/231 |
| 5,659,226 A | * | 8/1997 | Shigeta | 313/491 |
| 6,034,758 A | * | 3/2000 | Petera | 349/103 |
| 6,266,038 B1 | * | 7/2001 | Yoshida et al. | 345/100 |
| 6,326,981 B1 | * | 12/2001 | Mori et al. | 345/694 |

FOREIGN PATENT DOCUMENTS

| | | | |
|---|---|---|---|
| JP | 07-248482 | 9/1995 | ........... G02F/1/133 |
| JP | 10-078590 | 3/1998 | ......... G02F/1/1343 |

* cited by examiner

*Primary Examiner*—Don Wong
*Assistant Examiner*—Trinh Do Dinh
(74) *Attorney, Agent, or Firm*—Young & Thompson (57) ABSTRACT

A color organic EL display is provided with first electrodes extending in a column direction, second electrodes extending in a row direction, pixels arranged in a row direction and a column direction, and an organic luminescence layer between the first electrode and the second electrode which emits luminescence by applying a voltage to the first and the second electrodes to make an electric current flow therebetween. The number of the first electrodes is twice of the number of displaying columns. The second electrode is provided at every two displaying rows. Each of the pixels consists of three sub pixels for three luminescence colors arranged in order in the row direction. Each of the sub pixels is provided in each of regions where the first electrodes intersect with the second electrodes in a plan view. The sub pixels are arranged while being shifted to each other by a half pitch in the row direction between adjacent two displaying rows. Luminescence color of sub pixels provided for the same first electrode is unified as a single color. The luminescence colors of three adjacent sub pixels arranged at three triangle positions in two adjacent displaying rows are different from each other.

21 Claims, 7 Drawing Sheets

FIG. 1 (PRIOR ART)

LIGHT

COLOR ORGANIC EL DISPLAY AND METHOD FOR DRIVING THE SAME

BACKGROUND OF THE INVENTION

1. Field of the Invention

The present invention relates to a color organic EL (electro-luminescent) display which is under development as a thin flat panel display and a driving method thereof and, in particular, relates to a color organic EL display and a driving method thereof where improved display quality is promoted.

2. Description of the Related Art

Figure 1:
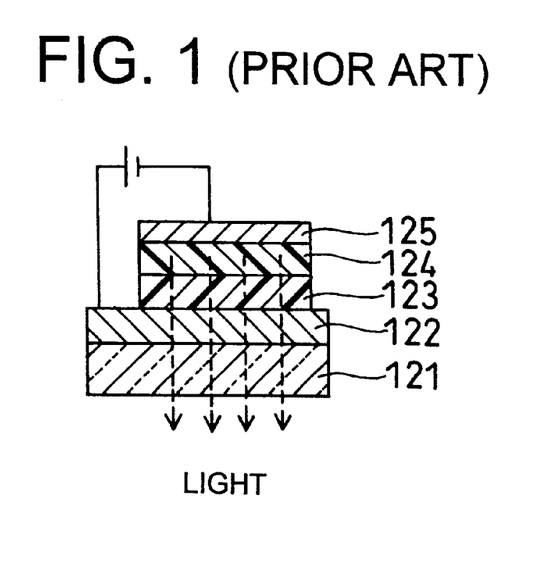
FIG. 1 is a schematic cross sectional view of an EL element and its luminescent principle.

A color organic EL display receives much attention as a color thin flat panel display similar to a liquid crystal display device (LCD) and a plasma display. FIG. 1 illustrates a schematic cross sectional view showing an EL element and the principle of its luminescence.

An EL element has the following constitution. A transparent electrode 122 made of indium tin oxide (ITO) is formed as a positive electrode on a transparent substrate 121 made of glass or film. Further, an organic hole injection layer 123 and an organic luminescence layer 124 are stacked subsequently on the ITO electrode 122 and a metal layer 125 is formed as a negative electrode on these layers. Here, the organic luminescence layer 124 emits luminescence toward the side of the transparent substrate 121, when a voltage is applied between the ITO electrode 122 and the metal electrode 125.

Further, as the constitution of an organic EL element, there are other ones such as a constitution where only an organic luminescence layer is formed between two electrodes, a constitution where an organic hole injection and transportation layer, an organic luminescence layer and an organic electron injection and transportation layer are formed subsequently between two electrodes, and a constitution where an organic hole injection layer, an organic hole transportation layer, an organic luminescence layer, and an organic electron transportation layer are formed subsequently between two electrodes.

Figure 2:
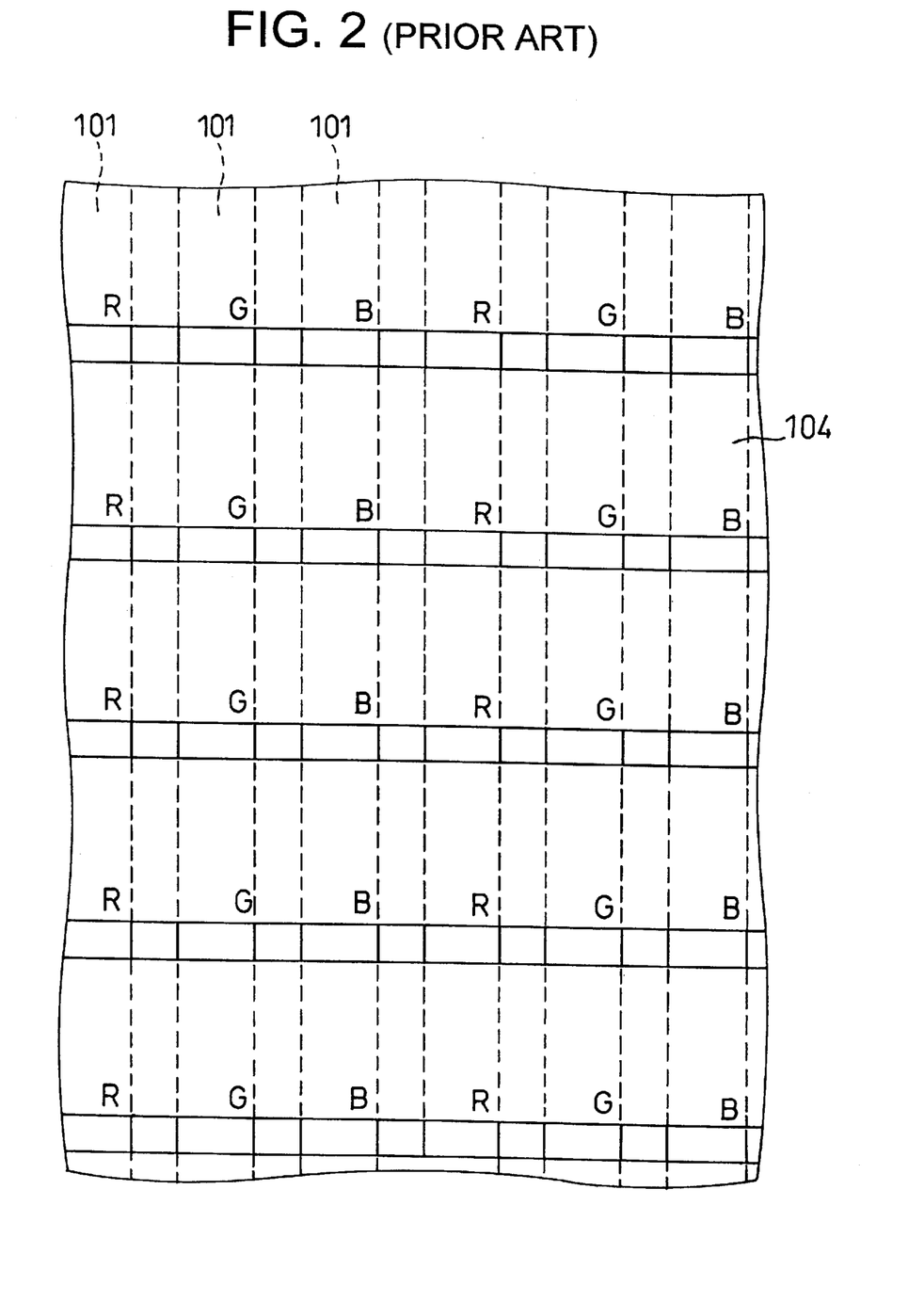
FIG. 2 is a schematic view of the stripe pattern in the prior art.
Figure 3:
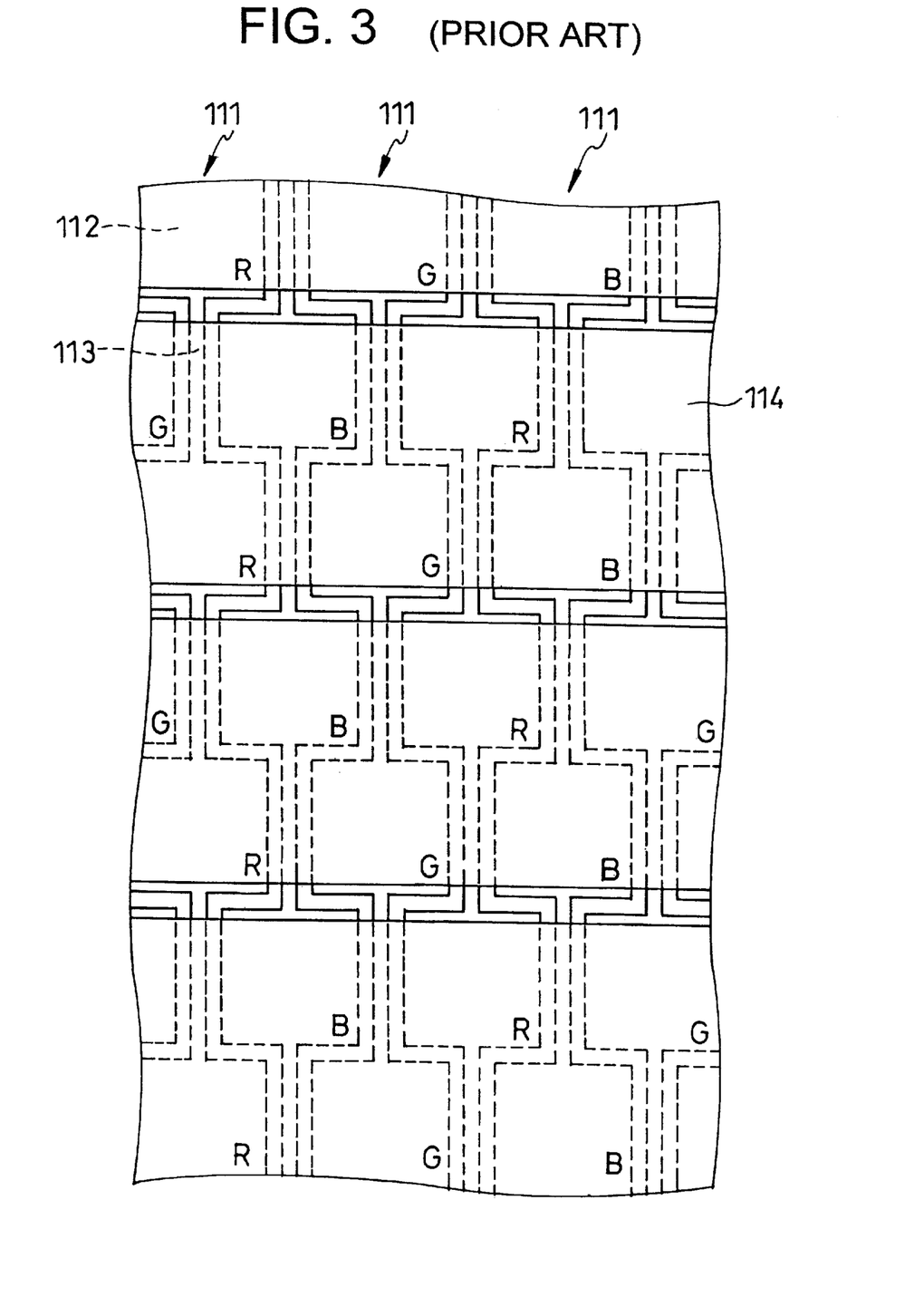
FIG. 3 is a schematic view of the delta pattern in the prior art.
Figure 4:
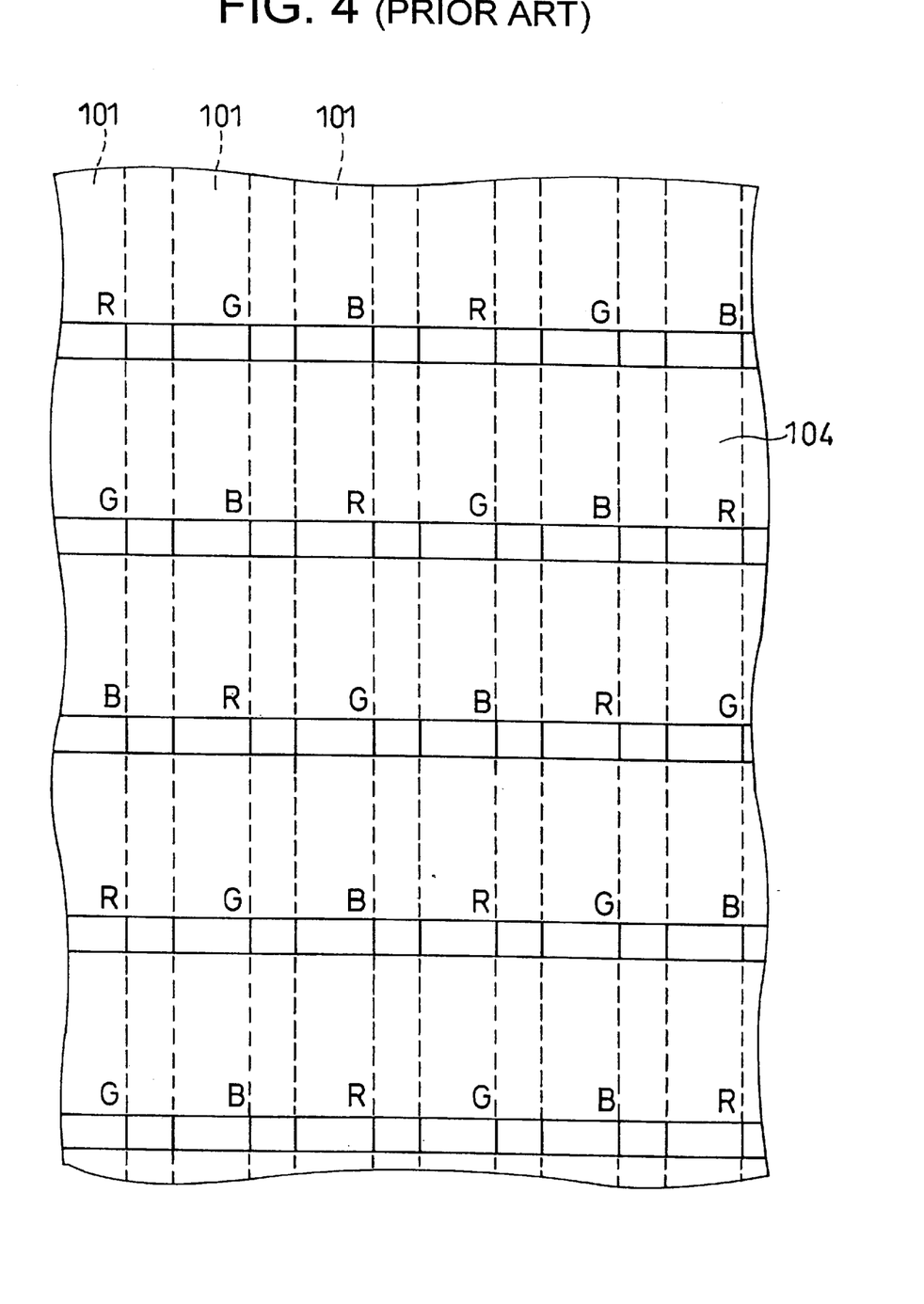
FIG. 4 is a schematic view of the mosaic pattern in the prior art.

As patterns for use in arrangement of sub pixels, there are a stripe pattern, a mosaic pattern and a delta pattern, for example. FIG. 2 is a schematic view of the conventional stripe pattern, FIG. 3 is a schematic view of the conventional delta pattern and FIG. 4 is a schematic view of the conventional mosaic pattern.

In the conventional stripe pattern, as shown in FIG. 2, a plurality of first electrodes 101 extending in the column direction are formed. This first electrode 101 corresponds to the ITO electrode 122. The length of each first electrode 101 in the horizontal direction (the row direction) is about one third of the length of one pixel in the horizontal direction. A plurality of second electrodes 104 extending in the row direction are formed above the first electrode 101 via an organic luminescence layer and the like. The second electrode 104 corresponds to the metal electrode 125. The width of each second electrode 104 is about the same length as the length of one pixel in the vertical direction (the column direction). The number of the first electrodes 101 is the same as the number of displaying columns and the number of the second electrodes 104 is the same as number of displaying rows. Here, luminescent color from the organic luminescence layer formed between the first electrode 101 and the second electrode 104 is unified at every column and repeated as the sequence of red(R) green (G) and blue (B) in the row direction.

In this stripe pattern, a single sub pixel exists at the cross section of the first electrode 101 and the second electrode 104. A single main pixel is composed of three color sub pixels arranged in the row direction.

This stripe pattern is preferable to display an image having many column lines and row lines such as a table since sub pixels having the same luminescent color are continuously arranged in the column direction.

Further, in the conventional delta pattern, as shown in FIG. 3, the first electrodes 111, extending in the column direction, is formed so that the number of the electrodes is one and a half times of the number of displaying columns. Each of the first electrodes 111 has a charge injection portion 112 and a wiring portion 113 which are formed alternatively. The lengths in the horizontal and vertical directions of the charge injection portion 112 are a half of the lengths in the horizontal and vertical directions of the pixel, respectively. The charge injection portion 112 has a regular square shape or a similar one. The length in the vertical direction of the wiring portion 113 is a half of that of a pixel and the length in the horizontal direction is extremely narrow in comparison with that of the charge injection portion 112. The numbers of the charge injection portions 112 and the wiring portions 113 are the same as the number of displaying rows per the single electrode 111. Further, the charge injection portion 112 and the wiring portion 113 are arranged alternatively in the row direction. A plurality of the second electrodes 114 are formed above the first electrode 111 via an organic luminescence layer and the like. The second electrode 114 extends in the row direction. The number of the second electrodes 114 is the same as that of displaying rows. The first electrode 111 corresponds to the ITO electrode 122 and the second electrode 104 corresponds to the metal electrode 125.

In this delta pattern, a single pixel is composed of the charge injection portions 112 for two colors adjacent to each other in the row direction and the charge injection portion 112 for another different luminescent color, which is provided directly above or directly under them. Namely, a single pixel is composed of three charge injection portions 112 which are located at each peak of "Δ" or its reversed shape.

The delta pattern is preferable to display a natural image or a moving image since there is more irregularity of arrangement of sub pixels in comparison with the stripe pattern.

Further, in the conventional mosaic pattern, as shown in FIG. 4, the first electrode 101 and the second electrode 104 are arranged in a manner similar to the stripe pattern in FIG. 2. But, location of luminescent color of an organic luminescence layer formed between two electrodes is shifted every sub pixel at every one row in the regulated direction. Therefore, the same luminescent color can be obtained every three rows if one pays his/her attention to a series of the first electrode 101. In this mosaic pattern, a single pixel is composed of sub pixels for three colors arranged in the row direction.

The mosaic pattern provides advantages of both the stripe pattern and the delta pattern. In Japanese Patent Laid-open Publication Nos. Hei. 7-248482 and Hei. 10-78590, color LCDs having the mosaic pattern are disclosed.

In the conventional stripe pattern, however, there is a problem where display quality is different between a vertical line and a horizontal line when an image except a white line with emitting luminescence having the same intensity from three sub pixels is displayed, because sub pixels for three colors are arranged adjacently in order in the row direction, while sub pixels having the same color are continuously arranged in the column direction. Namely, there is different display quality between a vertical line and a horizontal line since a horizontal line is displayed as a fine dot line in case of displaying other color's line except white, though both vertical and horizontal lines are displayed as continuous line in case of displaying a white line.

Further, in the conventional delta pattern, a vertical line is displayed in a zigzag fashion contrary to the stripe pattern. This deteriorates the display quality and is not appropriate to display an image including many vertical and horizontal lines such as a table.

Further, in the conventional mosaic pattern, a series of the first electrode 101 includes sub pixels for three colors. Namely, three colors are illuminated by a single first electrode 101. Thus, the order of outputting signal for each color needs to be changed every one displaying row and signal processing is complicated.

Further, a panel is defined into the upper and the lower portions and two driving circuits for driving the first electrodes are prepared for driving these defined portions in case when a display has many pixels located adjacently to each other. In such case, however, where the above patterns are adopted, displayed image shows discontinuity between the upper portion and the lower portion, if characteristics of the above two driving circuits are different from each other. Further, in case of driving a panel with defining into upper and lower portions, a frame memory having relatively large capacity for storing a half of the image data signal is needed and this increases manufacturing cost.

SUMMARY OF THE INVENTION

An object of the present invention is to provide a color organic EL display and a driving method thereof where the display quality can be improved without complicating its driving method.

A color organic EL display according to the present invention comprises first electrodes extending in a column direction, second electrodes extending in a row direction, pixels arranged in a row direction and a column direction, and an organic luminescence layer between the first electrode and the second electrode which emits luminescence by applying a voltage to the first and the second electrodes to make an electric current flow therebetween. The number of the first electrodes is twice of the number of displaying columns. The second electrode is provided at every two displaying rows. Each of the pixels consists of three sub pixels for three luminescence colors arranged in order in the row direction. Each of the sub pixels is provided in each of regions where the first electrodes intersect with the second electrodes in a plan view. The sub pixels are arranged while being shifted to each other by a half pitch in the row direction between adjacent two displaying rows. Luminescence color of sub pixels provided for the same first electrode is unified as a single color. The luminescence colors of three adjacent sub pixels arranged at three triangle positions in two adjacent displaying rows are different from each other.

According to the present invention, a driving method for the first electrode can be simplified since luminescent color from a plurality of sub pixels, provided at the same first electrode, is unified as a single color. Further, smooth displaying can be attained even when an image includes a plenty of vertical lines and horizontal lines such as a table, a moving image and a natural image, since the distances between sub pixels of the same color are relatively uniform each other in both the column and row directions. Further, since an image can be displayed by driving two displaying rows adjacent to each other simultaneously, a new driving method which is similar to the driving method where a panel is defined into two portions and these are driven simultaneously can be adopted. Therefore, high speed scanning can be attained even if a panel is not split into upper and lower portions. Also, a continuous image in a panel can be displayed even when two driving circuits are used and characteristics of them are slightly different from each other. Further, the memory capacity for storing image data can be reduced.

If a luminescence prevention film for preventing a generation of luminescence emitted from a region between the wiring portion and the second electrode is formed on the wiring portion, or a shielding layer is provided on this wiring portion so that this layer prevents the luminescence generated from a region between the wiring portion and the second electrode from being leaked toward outside from the first electrode, a preferable image quality can be obtained by blocking displaying at unnecessary portions.

The method of driving any one of the above mentioned color organic EL displays according to the present invention comprises the step of applying voltages to the first and second electrodes by passive matrix way on the premise that the first electrode is a data electrode and the second electrode is a scanning electrode.

DETAILED DESCRIPTION OF THE PREFERRED EMBODIMENT

Figure 5:
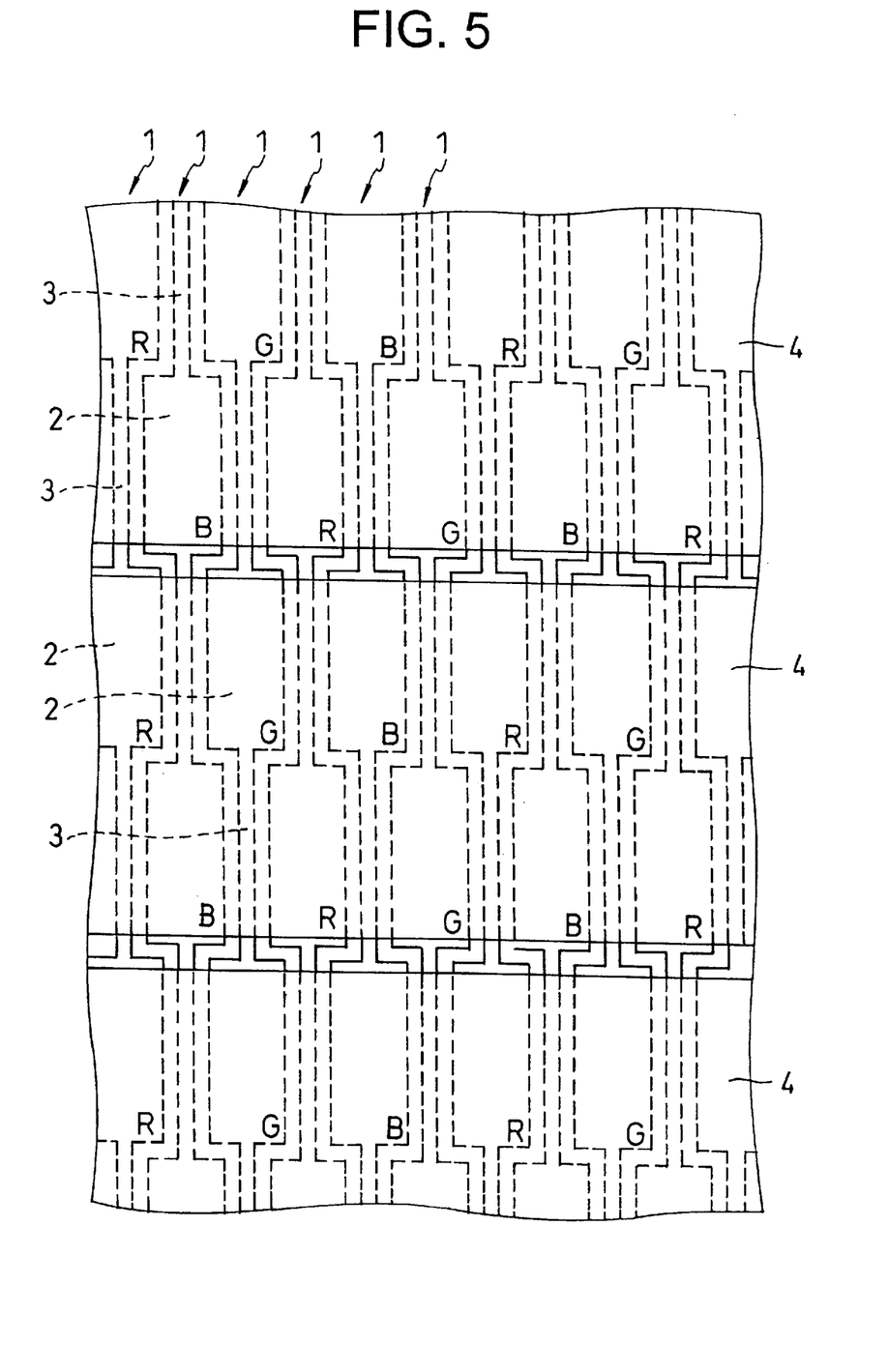
FIG. 5 is a schematic view showing a color organic display EL display according to one embodiment of the present invention.

Preferred embodiments of the present invention will be described with reference to the accompanying drawings hereafter. FIG. 5 is a schematic view showing a color organic display EL display according to an embodiment of the present invention.

In this embodiment, the number of first electrodes (data ilk electrodes) 1 is twice of the number of displaying columns. The first electrode 1 extends in the column direction. Each of the first electrode 1 includes a charge injection portion 2 and a wiring portion 3 which are arranged alternatively. The length of the charge injection portion 2 in the horizontal direction (the row direction) is one third of that of a pixel and the length thereof in the vertical direction (the column direction) is the same as that of a pixel. The lengths of the charge injection portion 2 in the horizontal direction and the vertical direction are about 0.108 mm and 0.36 mm, respectively. Namely, the charge injection portion 2 has a rectangular shape and the aspect ratio is from 27:10 to 10:3, for example, to which the present invention is not limited. The length of the wiring portion 3 in the vertical direction is almost the same as that of a pixel, but the length in the horizontal direction is extremely narrower than that of the charge injection portion 2. The numbers of the charge injection portion 2 and the wiring portion 3 are a half of the number of displaying rows per one first electrode, respectively. Further, the charge injection portion 2 and the wiring portion 3 are arranged alternatively in the row direction.

A plurality of second electrodes 4 (scanning electrodes) extending in the row direction are formed above the first electrode 1 via an organic luminescence layer and the like (not shown in the figure). The width of the second electrode 4 is twice of the length of the pixel in the vertical direction (for example, about 0.72 mm). A piece of the second electrode 4 covers the charge injection portions 2 for two displaying rows.

Luminescent color from the organic luminescence layer formed between the first electrode 1 and the second electrode 4 is unified at every single first electrode 1. With respect to one displaying row, the organic luminescence layer is formed repeatedly as the sequence of red(R), green (G), and blue (B) above the charge injection portion 2 in the row direction. With respect to displaying rows adjacent to each other, the organic luminescence layer for one color is formed on the charge injection portion 2 connected to the wiring portion 3 located between the organic luminescence layers for other two colors which are adjacent to each other among displaying rows. Namely, with respect to one displaying row, the organic luminescence layer for blue color is formed at the upper row or the lower row by one row from one displaying row where the organic luminescence layer for red color and the organic luminescence layer for green color are adjacent to each other. The organic luminescence layer for red color is formed at the upper row or the lower row by one row from one displaying row where the organic luminescence layer for green color and the organic luminescence layer for blue color are adjacent to each other. Also, the organic luminescence layer for green color is formed at the upper row or the lower row by one row from one displaying row where the organic luminescence layer for blue color and the organic luminescence layer for red color are adjacent to each other.

Here, the first electrode 1 (the charge injection portion 2) corresponds to the ITO electrode 122 and the second electrode 4 corresponds to the metal electrode 125.

In this electrode pattern, one pixel (a main pixel) is composed of three sub pixels which are arranged in the order of red, green and blue in the row direction. Such pixels are arranged with shifting a half pith each other among displaying rows which are adjacent to each other.

Figure 6:
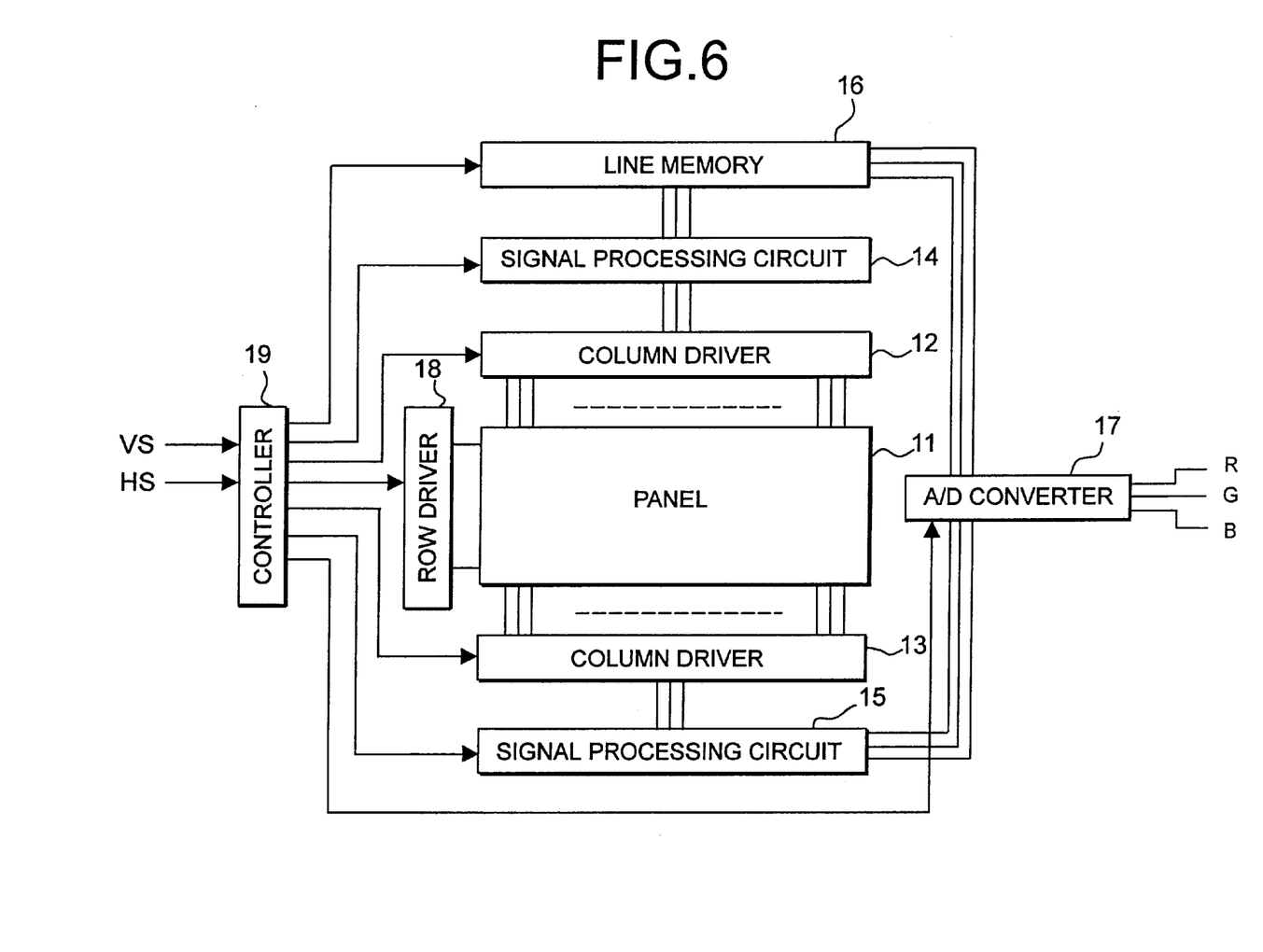
FIG. 6 is a block diagram showing circuitry of the color organic EL display according to one embodiment of the present invention.

FIG. 6 is a block diagram showing circuitry of the color organic EL display according to the embodiment of the present invention. In this embodiment, column drivers 12 and 13 connected to a panel 11 having the above electrode pattern are provided. The column driver 12 is connected to the upper displaying row of two displaying rows covered with a piece of the second electrode 4, namely, the first electrode 1 where the charge injection portion 2 is located at the odd numbered displaying row from the upper portion.

On the other hand, the column driver 13 is connected to the lower displaying row of the above two displaying rows, namely, the first electrode 1 where the charge injection portion 2 is located at the even numbered displaying row from the upper portion. The column drivers 12 and 13 are connected to signal processing circuits 14 and 15, respectively, with three routes for three colors. Furthermore, the signal processing circuit 14 is connected to a line memory 16 with three routes. The signal processing circuit 15 and the line memory 16 are connected to an analog/digital (A/D) converter 17 with three routes. Three color's analog data signals R, G, and B are inputted to the A/D converter 17. A row driver 18 is provided to scan the second electrodes 4 in the panel 11 having the above patterned electrodes. Also, a controller 19 is provided to receive a vertical synchronizing signal VS and a horizontal synchronizing signal HS, and controls the operations of the column drivers 12 and 13, the signal processing circuits 14 and 15, the line memory 16, the A/D converter 17, and the row driver 18. The controller 19 generates control signals such as a clock signal and a start pulse signal for the shift register provided in the row driver based on the vertical synchronizing signal VS and the horizontal synchronizing signal HS.

The operation of the color organic EL display of the embodiment having the above constitution will be explained hereafter. The color organic EL display of the embodiment is driven by a passive matrix method.

When the A/D converter 17 receives the analogue data signals R, G, and B, these signals are converted into digital signals. Each of digitized data signals for an odd numbered row is outputted to the line memory 16 and that signal for an even numbered row is outputted to the signal processing circuit 15. Data signal for the even numbered row is latched, converted into an analogue signal and processed with γ correction by the signal processing circuit 15. Then, this signal is outputted to the column driver 13. On the other hand, data signal for the odd numbered row is memorized by one displaying row in the line memory 16. Then, this signal is outputted to the signal processing circuit 14 where the signal is latched, converted into an analogue signal, processed with 7 correction and outputted to the column driver 12 in a manner similar to the case of the even numbered row. Furthermore, the row driver 18 scans the second electrode 4 based on the vertical synchronizing signal VS and the horizontal synchronizing signal HS. Then, when the column drivers 12 and 13 supply data signals to the first electrode 1, sub pixels located at two displaying rows between the second electrode 4 and the first electrode 1, which are being scanned, emits luminescence simultaneously.

According to the above embodiment, the distances between sub pixels having the same color are almost equal to each other in the row direction and in the column direction. Hence, display quality can be uniformed in both directions even when a natural image or a moving image is displayed. Further, sub pixels having the same color are discretely arranged. Therefore, a metal mask having openings with mesh like can be used in the process of forming an organic luminescence layer. In the conventional stripe pattern, the strength of a mask in a specific direction is weak because an opening formed with a fluted shape is required. In case of manufacturing a display of the present embodiment, however, a metal mask of which strength is remarkably improved can be used. Therefore, deformation of a metal mask can be prevented and pattering accuracy is improved.

Further, jaggedness on a vertical line is restrained in comparison with the conventional delta pattern. In case of the same number of displaying rows in a display, the number of rows of charge injection portions can be reduced to a half of that of the conventional delta pattern.

Further, a series of the first electrode 1 corresponds to only a single sub pixel having a single color. Hence, the constitution of driving circuits (the column drivers 12 and 13) can be simplified and its driving method comes to be easy in comparison with the conventional mosaic pattern.

According to the embodiment, two displaying rows including a series of the second electrode 4 can be driven simultaneously by two column drivers 12 and 13. Hence, a single row driver 18 is sufficient to scan all the second electrodes 4, as shown in FIG. 6, even though the driving method in the embodiment is equivalent to the driving method where a panel is split into two portions. Further, it is easy to secure the patterning accuracy in the process of forming since the width of the second electrode 4 doubles compared with that of the conventional display which is driven by one displaying row. Moreover, there is an effect that resistance value is decreased because of the wider width. In addition, even if the driving method is equivalent to the method where a panel is split into two portions, the display data only for one displaying row is stored in the memory. Therefore, a mass memory used in the conventional frame memory can not be needed, and an image quality equal to or more than that in the conventional method can be obtained by using the line memory 16 shown in FIG. 6. In addition, the displaying row driven by each of the column drivers 12 or 13 is always consecutive. Hence, discontinuous feeling of an image is not recognized thereby even if there are some differences in the characteristic between the column drivers 12 and 13.

The first electrode 1 can be formed by the photolithography method on the glass substrate, for example. The second electrode 4 can be formed by patterning which uses a shadow mask, for example, after the organic luminescence layer and the like are formed.

Figure 7A:
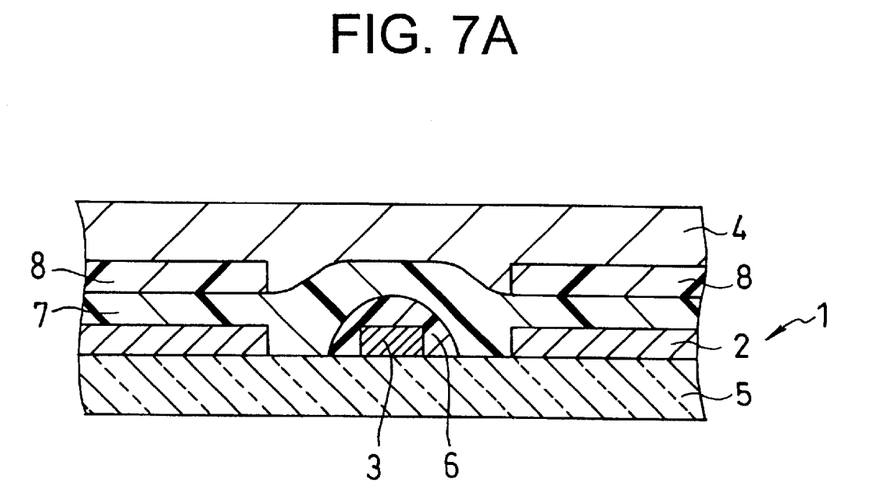
FIG. 7A is a cross sectional view of an embodiment including a luminescence blocking layer.

Moreover, it is preferred that a luminescence prevention film which prevents the generation of luminescence between the wiring portion 3 and the second electrode 4 or the shielding film for shielding the luminescence leakage to outside, even if such luminescence is generated, is formed between the wiring portion 3 and the second electrode 4. FIG. 7A is a schematic cross sectional view of the embodiment showing provision of the luminescence prevention film and FIG. 7B is a schematic cross sectional view of the embodiment showing provision of the shielding film.

When the luminescence prevention film is formed, as shown in FIG. 7A, the first electrode 1 having the charge injection portion 2 and the wiring portion 3 is formed on a glass substrate 5, and an insulative polyimide film 6 is formed on the wiring portion 3, for example. Then, an organic hole injection layer 7 is formed on the entire surface and an organic luminescence layer 8 corresponding to luminescence color of the sub pixel is formed. In addition, the second electrode 4 is formed for every two displaying rows. When the polyimide film 6 is not provided, it is happened to emit luminescence from an area between the first electrode 1 where the organic luminescence layer 8 is not formed and the second electrode 4 because of the existence of the organic hole injection layer 7. However, if the polyimide film 6 is provided, luminescence can be prevented from being generated in such area since electric current does not flow between the first electrode 1 and the second electrode 4 in the area. As a result, a high quality image can be obtained by preventing luminescence from being generated in an unnecessary part. It is preferable that the luminescence prevention film is provided not only on the wiring portion 3 but also on the glass substrate between the first electrodes adjacent to each other in the row direction. Thus, it is possible that leakage of luminescence is prevented further by providing the luminescence prevention film in an area between the first electrodes adjacent to each other in the row direction.

Figure 7B:
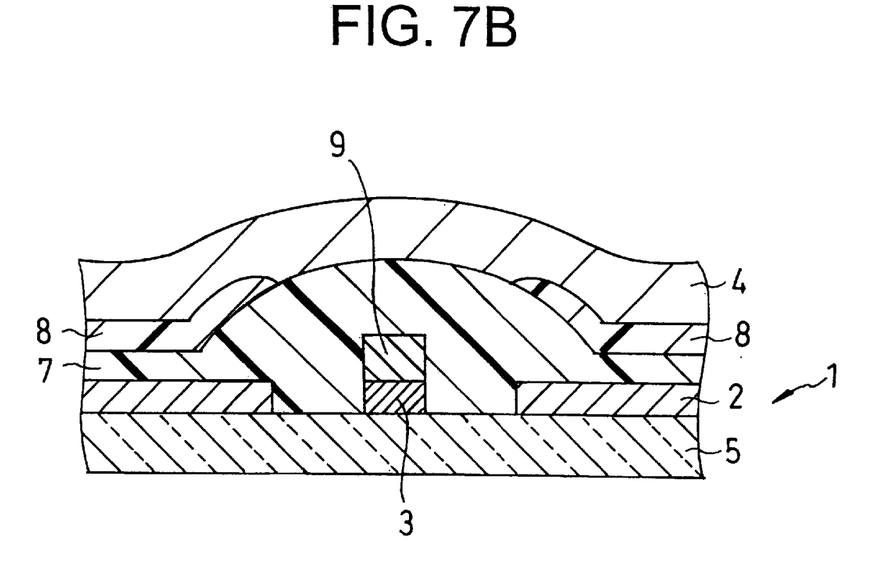
FIG. 7B is a cross sectional view of the embodiment including a shielding layer.

On the other hand, when a shielding film is provided, as shown in FIG. 7B, a metallic wiring 9 made of Ni, Au, Cr, or the like, for example, is formed on the wiring portion 3. Then, the organic hole injection layer 7, the organic luminescence layer 8, and the second electrode 4 are formed as well as the case where the luminescence prevention film is provided. In the color organic EL display having the above constitution, luminescence is emitted between the metallic wiring 9 and the second electrode 4. However, luminescence does not leak outside since it is shielded by the metallic wiring 9. Therefore, a high quality image can be obtained by preventing luminescence from being generated in an unnecessary part. Moreover, the resistance value between the charge injection portions 2 is decreased by the metallic wiring 9. In case where the luminescence prevention film is provided as shown in FIG. 7A, the effect of such decrease in the resistance value can be obtained by forming a metallic wiring on the wiring portion 3. Therefore, even when the luminescence prevention film is provided, it is desirable to provide the metallic wiring 9. Moreover, the metallic wiring 9 as the shielding film is formed only on the wiring portion 3 in FIG. 7B. However, it is preferable that the shielding film is provided on the glass substrate between the first electrodes adjacent to each other in the row direction. Thus, it is possible that leakage of luminescence is prevented further by providing the shielding film in an area between the first electrodes adjacent to each other in the row direction. It is preferable that the shielding film is provided not only on the wiring portion 3 but also on the glass substrate between the wiring portion and the adjacent charge injection portion in a region without contacting each other in the row direction like the luminescence prevention film shown in FIG. 7A. Thus, it is possible that leakage of luminescence is prevented further by providing the shielding film in an area between the first electrodes adjacent to each other in the raw direction.

The constitution between electrodes is not limited to the one shown in FIG. 7A or FIG. 7B, even in case where either of the luminescence prevention film or the shielding film is provided or when these films are not formed. For example, only the organic luminescence layer between the two electrodes maybe provided. Also, the organic hole injection and transportation layer, the organic luminescence layer, and the organic electron injection and transportation layer may be layered subsequently between the two electrodes, and the organic hole injection layer, the organic hole transportation layer, the organic luminescence layer, and the organic electron transportation layer may be layered subsequently between the two electrodes.

In addition, the line memory 16 is provided in order to display two displaying rows simultaneously in the above mentioned embodiments. However, the present invention is not limited thereto, and the delay line may be provided instead.

What is claimed is:

1. A color organic EL display comprising;
   first electrodes extending in a column direction, the number of said first electrodes being twice of the number of displaying columns;

second electrodes extending in a row direction, said second electrode being provided at every two displaying rows, pixels arranged in a row direction and a column direction, each of said pixels consisting of three sub pixels for three luminescence colors arranged in order in the row direction, each of said sub pixels being provided in each of regions where said first electrodes intersect with said second electrodes in a plan view, said sub pixels being arranged while being shifted to each other by a half pitch in the row direction between adjacent two displaying rows, luminescence color of sub pixels provided for the same first electrode being unified as a single color, and the luminescence colors of three adjacent sub pixels arranged at three triangle positions in two adjacent displaying rows being different from each other; and an organic luminescence layer between said first electrode and said second electrode which emits luminescence by applying a voltage to said first and said second electrodes to make an electric current flow therebetween.

2. The color organic EL display according to claim 1, wherein each of said first electrodes comprises:

charge injection portions provided one to each of sub pixels, the number of said charge injection portions being a half of the number of the displaying rows; and wiring portions connecting said charge injection portions to each other.

3. The color organic EL display according to claim 2, further comprising a luminescence prevention film provided on said wiring portion which prevents luminescence from being generated between said wiring portion and said second electrode.

4. The color organic EL display according to claim 2, further comprising a shielding film provided on said wiring portion which prevents luminescence generated from a region between said wiring portion and said second electrode from being leaked to outside from said first electrode.

5. The color organic EL display according to claim 3, further comprising a shielding film provided on said wiring portion which prevents luminescence generated from a region between said wiring portion and said second electrode from being leaked to outside from said first electrode.

6. The color organic EL display according to claim 1, wherein said sub pixel has a rectangular shape of which a length in the column direction is from 2.7 to 10/3 times the length thereof in the row direction.

7. The color organic EL display according to claim 2, wherein said sub pixel has a rectangular shape of which a length in the column direction is from 2.7 to 10/3 times the length thereof in the row direction.

8. The color organic EL display according to claim 3, wherein said sub pixel has a rectangular shape of which a length in the column direction is from 2.7 to 10/3 times the length thereof in the row direction.

9. The color organic EL display according to claim 4, wherein said sub pixel has a rectangular shape of which a length in the column direction is from 2.7 to 10/3 times the length thereof in the row direction.

10. The color organic EL display according to claim 5, wherein said sub pixel has a rectangular shape of which a length in the column direction is from 2.7 to 10/3 times the length thereof in the row direction.

11. The color organic EL display according to claim 1, further comprising at least one line memory having a capacity needed to display at least said two displaying rows simultaneously.

12. The color organic EL display according to claim 2, further comprising at least one line memory having a capacity needed to display at least said two displaying rows simultaneously.

13. The color organic EL display according to claim 3, further comprising at least one line memory having a capacity needed to display at least said two displaying rows simultaneously.

14. The color organic EL display according to claim 4, further comprising at least one line memory having a capacity needed to display at least said two displaying rows simultaneously.

15. The color organic EL display according to claim 5, further comprising at least one line memory having a capacity needed to display at least said two displaying rows simultaneously.

16. The color organic EL display according to claim 6, further comprising at least one line memory having a capacity needed to display at least said two displaying rows simultaneously.

17. The color organic EL display according to claim 7, further comprising at least one line memory having a capacity needed to display at least said two displaying rows simultaneously.

18. The color organic EL display according to claim 8, further comprising at least one line memory having a capacity needed to display at least said two displaying rows simultaneously.

19. The color organic EL display according to claim 9, further comprising at least one line memory having a capacity needed to display at least said two displaying rows simultaneously.

20. The color organic EL display according to claim 10, further comprising at least one line memory having a capacity needed to display at least said two displaying rows simultaneously.

21. A method of driving the color organic EL display according to claim 1, comprises the step of:

applying voltages to said first and second electrodes by passive matrix way on the premise that said first electrode is a data electrode and said second electrode is a scanning electrode.

* * * * *